(12) United States Patent
Nishioka

(10) Patent No.: US 12,184,234 B2
(45) Date of Patent: Dec. 31, 2024

(54) SEMICONDUCTOR DEVICE

(71) Applicant: Renesas Electronics Corporation, Tokyo (JP)

(72) Inventor: Soshiro Nishioka, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 15 days.

(21) Appl. No.: 18/342,888

(22) Filed: Jun. 28, 2023

(65) Prior Publication Data

US 2024/0022211 A1 Jan. 18, 2024

(30) Foreign Application Priority Data

Jun. 29, 2022 (JP) ................................. 2022-104105

(51) Int. Cl.
*H03B 5/36* (2006.01)

(52) U.S. Cl.
CPC .................................. *H03B 5/364* (2013.01)

(58) Field of Classification Search
CPC . H03B 5/364; H03B 5/06; H03B 5/36; H03B 5/366; H03B 5/32; H03B 2200/0094; H03B 29/00; H03H 9/19
See application file for complete search history.

(56) References Cited

U.S. PATENT DOCUMENTS

2019/0190447 A1* 6/2019 Kraus ...................... H03B 5/06
2022/0173699 A1* 6/2022 Verlinden ................ H03B 5/32

OTHER PUBLICATIONS

Shunta Iguchi et al., "92% Start-up Time Reduction by Variation-Tolerant Chirp Injection (CI) and Negative Resistance Booster (NRB) in 39MHz Crystal Oscillator", 2014 Symposium on VLSI Circuits Digest of Technical Papers, Jun. 2014, pp. 236-237.
Karim M. Megawer et al., "A 54MHz Crystal Oscillator with 30× Sta rt-Up Time Reduction Using 2-Step Injection in 65nm CMOS", 2019 IEEE International Solid-State Circuits Conference(ISSCC), Feb. 2019, pp. 302-304.

* cited by examiner

*Primary Examiner* — Jeffrey M Shin
(74) *Attorney, Agent, or Firm* — SCULLY, SCOTT, MURPHY & PRESSER, P.C.

(57) ABSTRACT

A semiconductor device includes a crystal oscillator circuit, a first noise application circuit, and a second noise application circuit. The first noise application circuit is connected to the crystal oscillator circuit and is configured to drive a crystal resonator by selectively applying initial noises of opposite phases to a first external terminal and a second external terminal. The second noise application circuit applies a second noise to the first external terminal by amplifying a signal at the first external terminal and returning the amplified signal to the first external terminal, thereby driving an oscillation amplifier and a crystal resonator of the crystal oscillator circuit and shortening a start-up time of the crystal oscillator circuit.

9 Claims, 9 Drawing Sheets

SEMICONDUCTOR DEVICE

CROSS-REFERENCE TO RELATED APPLICATION

This application claims priority under 35 U.S.C. 119 to Japanese Patent Application No. 2022-104105 filed on Jun. 29, 2022. The disclosure of Japanese Patent Application No. 2022-104105 including the specification, drawings and abstract is incorporated herein by reference in its entirety.

BACKGROUND

This disclosure relates to a semiconductor device, and is a technique effectively applied in particular to a semiconductor device having an oscillator circuit that oscillates while being coupled with a crystal resonator.

There are disclosed techniques listed below.
[Non-Patent Document 1] Shunta Iguchi, "92% Start-up Time Reduction by Variation-Tolerant Chirp Injection (CI) and Negative Resistance Booster (NRB) in 39 MHz Crystal Oscillator", IEEE Symposium. VLSI Circuits Digest of Technical Papers, June 2014, pp. 236-237
[Non-Patent Document 2] Karim M. Megawer, "A 54 MHz Crystal Oscillator with 30× Start-Up Time Reduction Using 2-Step Injection in 65 nm CMOS", IEEE International Solid-State Circuits Conference (ISSCC), February 2019, pp. 302-304

As an oscillator circuit used for a semiconductor device, there is a crystal oscillator circuit composed of a crystal resonator, a single-stage amplifier such as an inverter, a feedback resistor, and two external load capacitors. This crystal oscillator circuit has good frequency accuracy, but its start-up time is long. Non-Patent Document 1 and Non-Patent Document 2 are proposals of techniques for shortening the start-up time of a crystal oscillator circuit.

Non-Patent Document 1 is a Chirp Injection method in which the output CLK of a VCO (voltage controlled oscillator) is applied to a crystal resonator as initial noise to shorten the start-up time of the crystal oscillator circuit. Non-Patent Document 2 is a method of shortening the start-up time by applying the noise to the crystal resonator in two stages.

SUMMARY

In Non-Patent Document 1, it is conceivable that the effect of shortening the start-up time is small because the frequency of the VCO and the resonance frequency of the crystal cross only once with the noise application by the VCO alone.

In Non-Patent Document 2, a noise frequency that is almost the same as the crystal frequency is applied on the second stage, and thus the effect of shortening the start-up time is large, but a PLL (Phase Locked Loop Circuit) and an accurately trimmed internal oscillator (DCRO) are necessary. Further, in Non-Patent Document 2, the internal oscillator requires a frequency accuracy of 0.5% when applying noise on the first stage, but achieving this is technically difficult and the increase in circuit scale is considered inevitable. In other words, Non-Patent Document 2 has a great effect of shortening the start-up time, but it is conceivable that the application to mass-produced semiconductor devices is difficult because of the large circuit scale.

An object of this disclosure is to provide a technique capable of shortening the start-up time of a crystal oscillator circuit while reducing the circuit scale.

Other problems and novel features will become apparent from the description of this specification and the accompanying drawings.

An outline of the representative embodiment in this disclosure will be briefly described below.

According to one embodiment, a semiconductor device includes: a first external terminal; a second external terminal; a crystal oscillator circuit connected to the first external terminal and the second external terminal; a first noise application circuit connected to the crystal oscillator circuit; and a second noise application circuit connected to the crystal oscillator circuit, wherein the crystal oscillator circuit includes: an oscillation amplifier connected between the first external terminal and the second external terminal; a feedback resistor element connected between the first external terminal and the second external terminal; an external first capacitor element connected between the first external terminal and an external ground potential line; an external second capacitor element connected between the second external terminal and the external ground potential line; and an external crystal resonator connected between the first external terminal and the second external terminal, wherein the first noise application circuit is configured to drive the crystal resonator by selectively applying initial noises of opposite phases to the first external terminal and the second external terminal, wherein the second noise application circuit includes: a third switch; a first capacitance coupling circuit; an amplifier circuit; and a second capacitance coupling circuit, wherein the third switch is provided between the first external terminal and the first capacitance coupling circuit, wherein the amplifier circuit is provided between the first capacitance coupling circuit and the second capacitance coupling circuit, wherein the second capacitance coupling circuit is connected to the first external terminal via the third switch, wherein the first capacitance coupling circuit is provided so as to take an alternating current component of a signal at the first external terminal by separating a direct current voltage at the first external terminal from a direct current voltage at an input terminal of the amplifier circuit, wherein the second capacitance coupling circuit is provided so as to output an alternating current component of the amplifier circuit by separating a direct current voltage at an output terminal of the amplifier circuit from a direct current voltage at the first external terminal, wherein the amplifier circuit is provided so as to amplify the alternating current component taken by the first capacitance coupling circuit, convert it into a clock signal, and drive the first external terminal with the converted clock signal, wherein the third switch is provided so as to prevent capacitance values of the first capacitance coupling circuit and the second capacitance coupling circuit from affecting oscillation by separating the amplifier circuit from the first external terminal after activation of the crystal oscillator circuit is completed, and wherein a second noise is applied to the first external terminal by amplifying the signal at the first external terminal and returning the amplified signal to the first external terminal by the second noise application circuit, thereby driving the oscillation amplifier and the crystal resonator and shortening a start-up time of the crystal oscillator circuit.

With a semiconductor device according to one embodiment described above, it is possible to shorten the start-up time of a crystal oscillator circuit while reducing the circuit scale.

DETAILED DESCRIPTION

Figure 1:
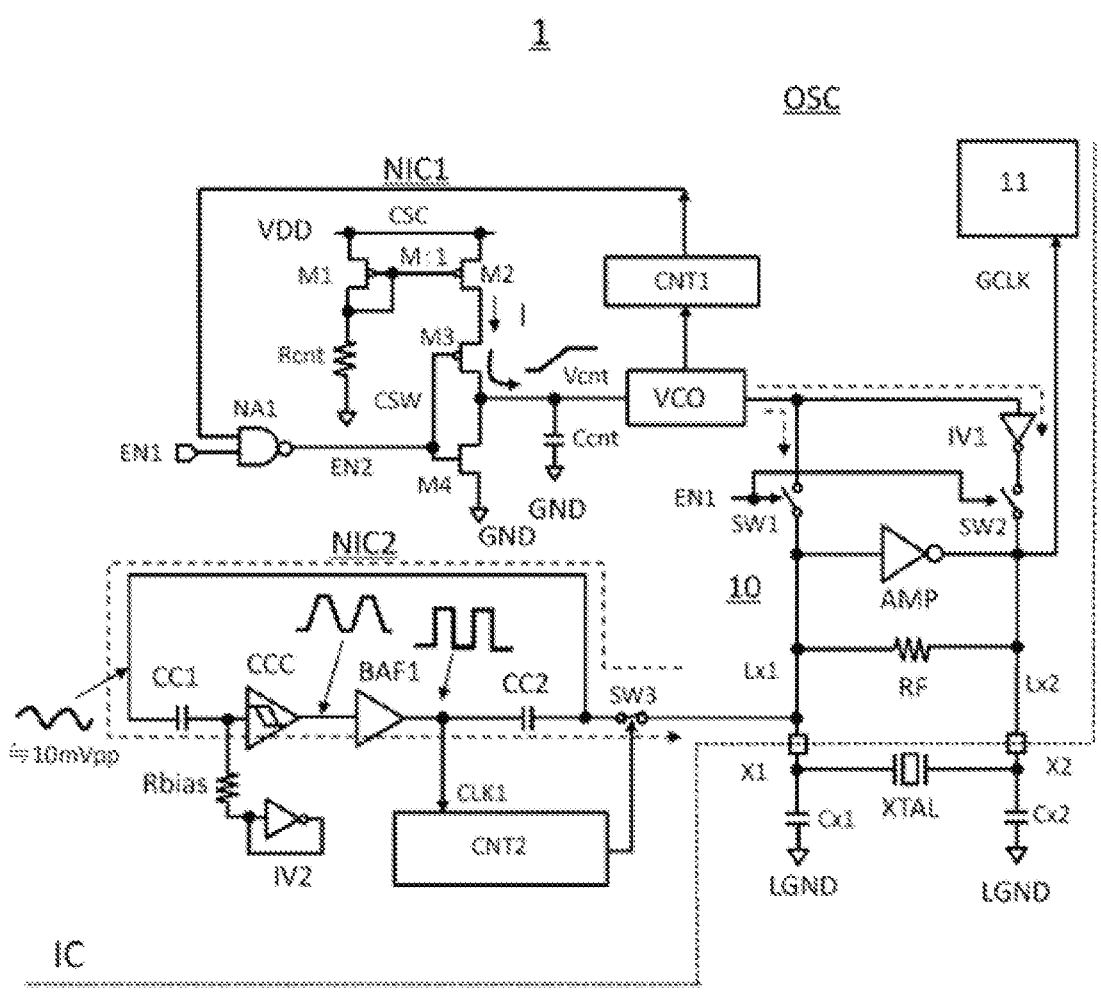
FIG. 1 is a schematic configuration diagram of a semiconductor device including a crystal oscillator circuit according to the first embodiment.

Hereinafter, embodiments will be described with reference to drawings. However, in the following description, the same components are denoted by the same reference characters and the repetitive description thereof will be omitted. Furthermore, the drawings are illustrated more schematically as compared with actual aspects in some cases in order to make the description clearer, but are mere an example and do not limit the interpretation of the present invention.

First Embodiment

FIG. 1 is a schematic configuration diagram of a semiconductor device including a crystal oscillator circuit according to the first embodiment.

As shown in FIG. 1, a semiconductor device 1 includes an oscillator circuit OSC formed in a semiconductor chip IC. In this configuration, a clock signal GCLK generated from the oscillator circuit OSC is supplied as an operation clock to a processing device 11 formed in the semiconductor chip IC. The processing device 11 can be, for example, a data processing device such as a central processing unit CPU, a USB (Universal Serial Bus) communication device, or a Bluetooth communication device for BLE (Bluetooth Low Energy) communication.

The oscillator circuit OSC includes a crystal oscillator circuit 10, a first-stage noise application circuit (referred to also as a first noise application circuit) NIC1, and a second-stage noise application circuit (referred to also as a second noise application circuit) NIC2. The first noise application circuit NIC1 and the second noise application circuit NIC2 are connected to the crystal oscillator circuit 10.

The crystal oscillator circuit 10 includes an external crystal resonator XTAL, a first external load capacitor element (first capacitor element) Cx1, a second external load capacitor element (second capacitor element) Cx2, a single-stage oscillation amplifier AMP such as an inverter, and a feedback resistor element RF.

The crystal resonator XTAL is connected between a first external terminal X1 and a second external terminal X2 of the semiconductor device 1 outside the semiconductor chip IC. The load capacitor element Cx1 is connected between the external terminal X1 and a ground potential line (external ground potential line) LGND provided outside the semiconductor chip IC. Similarly, the load capacitor element Cx2 is connected between the external terminal X2 and the ground potential line LGND.

The oscillation amplifier AMP and the feedback resistor element RF are connected between the first external terminal X1 and the second external terminal X2 inside the semiconductor chip IC. The oscillation amplifier AMP can be a single-stage inverting amplifier. The feedback resistor element RF is connected in parallel to the oscillation amplifier AMP in order to determine a DC (direct current) operating point of the oscillation amplifier AMP. By driving the external capacitor elements Cx1 and Cx2 and the external crystal resonator XTAL by the oscillation amplifier AMP and the feedback resistor element RF, the crystal resonator XTAL is oscillated. The clock signal GCLK generated by the crystal oscillator circuit 10 is output from an output terminal of the oscillation amplifier AMP connected to the second external terminal X2 and supplied to the processing device 11.

The first noise application circuit NIC1 is connected to the crystal oscillator circuit 10, and is configured to drive the crystal resonator XTAL by selectively applying initial noises of opposite phases to the first external terminal X1 and the second external terminal X2. The first noise application circuit NIC1 includes a first switch SW1, a second switch SW2, an inverter circuit IV1, a voltage controlled oscillator VCO, a first counter (first counter circuit) CNT1, a capacitor element Ccnt, a constant current circuit CSC, a current switch CSW, and a NAND circuit NA1.

An output terminal of the voltage controlled oscillator VCO is connected to a first wiring LX1 connected to the first external terminal X1 via the first switch SW1, and an output clock of the voltage controlled oscillator VCO is supplied to the first wiring LX1 connected to the first external terminal X1. Also, the output terminal of the voltage controlled oscillator VCO is connected to a second wiring LX2 connected to the second external terminal X2 via the inverter circuit IV1 and the second switch SW2, and the output clock of the voltage controlled oscillator VCO is inverted by the inverter IV1 and supplied to the second wiring LX2 connected to the second external terminal X2. A first enable signal EN1 is supplied to the first switch SW1 and the second switch SW2. The first switch SW1 and the second switch SW2 are selectively turned on based on the high level of the enable signal EN1, and the first switch SW1 and the second switch SW2 are selectively turned off based on the low level of the enable signal EN1.

An input terminal of the voltage controlled oscillator VCO is connected to the capacitor element Ccnt, and a clock signal oscillating at a frequency based on a voltage Vcnt accumulated in the capacitor element Ccnt is generated from the output of the voltage controlled oscillator VCO. The clock signal is supplied to the first switch SW1, the second switch SW2, and the counter CNT1.

The counter CNT1 counts the clock signals output from the voltage controlled oscillator VCO. The counter CNT1 counts the number of clock signals. An output signal of the counter CNT1 changes from the high level to the low level when the count number reaches a predetermined number.

The NAND circuit NA1 has a first input for receiving the output signal of the counter CNT1 and a second input for receiving the enable signal EN1. A second enable signal EN2 is output from an output of the NAND circuit NA1.

The constant current circuit CSC includes a pair of P channel MOSFETs M1 and M2, a first resistor element Rcnt, and an inverter-type current switch CSW. A source-drain path of the MOSFET M1 and the resistor element Rcnt are connected in series between a power supply wiring to which a power supply potential VDD, which is a first reference potential of the semiconductor device IC, is supplied and a ground wiring to which a ground potential GND, which is a second reference potential lower than the first reference potential, is supplied. A gate of the MOSFET M1 is connected to a gate of the MOSFET M2 and a drain of the MOSFET M1, and a source of the MOSFET M2 is connected to the power supply wiring to which the power supply potential VDD is supplied. Namely, the pair of MOSFETs M1 and M2 are connected in a current mirror configuration, and the mirror ratio (area ratio of the source regions) of the MOSFETs M1 and M2 is set to M:1. A current I output from a drain of the MOSFET M2 is supplied to the current switch CSW. Note that the resistor element Rcnt may be changed to a current source.

The current switch CSW is an inverter-type charge/discharge changeover switch, and includes a P channel MOSFET M3 and an N channel MOSFET M4. A source-drain path of the MOSFET M3 and a source-drain path of the MOSFET M4 are connected in series between the drain of the MOSFET M2 and the ground wiring to which the ground potential GND is supplied. A gate of the MOSFET M3 and a gate of the N channel MOSFET M4 are connected to receive the second enable signal EN2. A connection point between the source-drain path of the MOSFET M3 and the source-drain path of the MOSFET M4 is connected to the capacitor element Ccnt and the input of the voltage controlled oscillator VCO. The current switch CSW has a switch function for switching between charging and discharging of the capacitor element Ccnt.

The second noise application circuit NIC2 includes a first capacitance coupling circuit CC1, a clock conversion circuit CCC, an inverter threshold generation circuit IV2, a second resistor element Rbias, a buffer circuit BAF1, a second capacitance coupling circuit CC2, a second counter (second counter circuit) CNT2, and a third switch SW3.

The third switch SW3 is connected between the first wiring LX1 and the capacitance coupling circuit CC2, and the ON operation and OFF operation of the third switch SW3 are controlled by an output of the counter CNT2.

One end of the capacitance coupling circuit CC1 is connected between the third switch SW3 and the capacitance coupling circuit CC2, and the other end of the capacitance coupling circuit CC1 is connected to an input terminal of the clock conversion circuit CCC.

The threshold generation circuit IV2 is a bias setting circuit that generates the threshold of the inverter. The bias setting circuit is provided to set the bias potential of the input terminal of the clock conversion circuit CCC. The threshold generation circuit IV2 includes an inverter, and an input terminal and an output terminal of the inverter are connected. Also, an input of the inverter is connected to the input terminal of the clock conversion circuit CCC via the second resistor element Rbias. The second resistor element Rbias is a high resistance element for extracting only a DC voltage (direct current voltage) from the threshold generation circuit IV2. The threshold generation circuit IV2 is connected to the input terminal of the clock conversion circuit CCC such that a signal with a small amplitude can be amplified by setting the input terminal of the clock conversion circuit CCC to a predetermined bias potential, that is, a bias voltage with which a high gain can be obtained.

The clock conversion circuit CCC is configured as an amplifier circuit having a Schmitt trigger function (noise removal function), and its output terminal is connected to an input terminal of the buffer circuit BAF1. An output terminal of the buffer circuit BAF1 is connected to the capacitance coupling circuit CC2 and also to an input terminal of the second counter CNT2.

The second counter CNT2 receives a clock signal CLK1 from the output terminal of the buffer circuit BAF1 and counts the number of clocks of the clock signal CLK1. The output signal of the counter CNT2 changes from the high level to the low level when the count number reaches a predetermined number. The third switch SW3 is turned on by the high level of the output signal of the counter CNT2, and the third switch SW3 is turned off by the low level of the output signal of the counter CNT2.

The first capacitance coupling circuit CC1 is provided so as to take only the AC (alternating current) component of the signal at the external terminal X1 (wiring Lx1) by separating the DC (direct current) voltage at the external terminal X1 of the crystal oscillator circuit 10 from the DC voltage at the input terminal of the clock conversion circuit CCC which is an amplifier circuit.

The second capacitance coupling circuit CC2 is provided so as to output only the AC (alternating current) component of the clock conversion circuit CCC by separating the DC (direct current) voltage of the output terminal of the clock conversion circuit CCC from the DC (direct current) voltage of the external terminal X1.

The clock conversion circuit CCC is provided so as to amplify only the AC component taken by the first capacitance coupling circuit CC1, convert it into a clock signal, and drive the external terminal X1 with the converted clock signal. The converted clock signal is supplied to the external terminal X1 via the second capacitance coupling circuit CC2, thereby driving the external terminal X1. The noise removal function of the clock conversion circuit CCC is provided so as to remove the harmonic components due to power supply noise and amplify only signal components.

The third switch is provided so as to prevent the capacitance values of the first capacitance coupling circuit CC1 and the second capacitance coupling circuit CC2 from affecting the oscillation by separating the clock conversion circuit CCC from the external terminal X1 after the completion of the activation of the crystal oscillator circuit 10. The control signal for controlling the third switch SW3 is connected also to the clock conversion circuit CCC and the buffer circuit BAF1, and the clock conversion circuit CCC and the buffer circuit BAF1 are also stopped after the completion of the activation.

The second noise application circuit NIC2 applies the second noise to the external terminal X1 by amplifying the signal of the external terminal X1 and returning the amplified signal to the external terminal X1, thereby driving the oscillation amplifier AMP and the crystal resonator XTAL and shortening the start-up time of the crystal oscillator circuit 10.

The oscillator circuit OSC of the present embodiment can shorten the start-up time of the crystal oscillator circuit 10 by the first-stage noise application circuit NIC1 and the second-stage noise application circuit NIC2. The operations of the noise application circuit NIC1 and the noise application circuit NIC2 will be described below.

(Description of First Noise Application Circuit NIC1)

Figure 2:
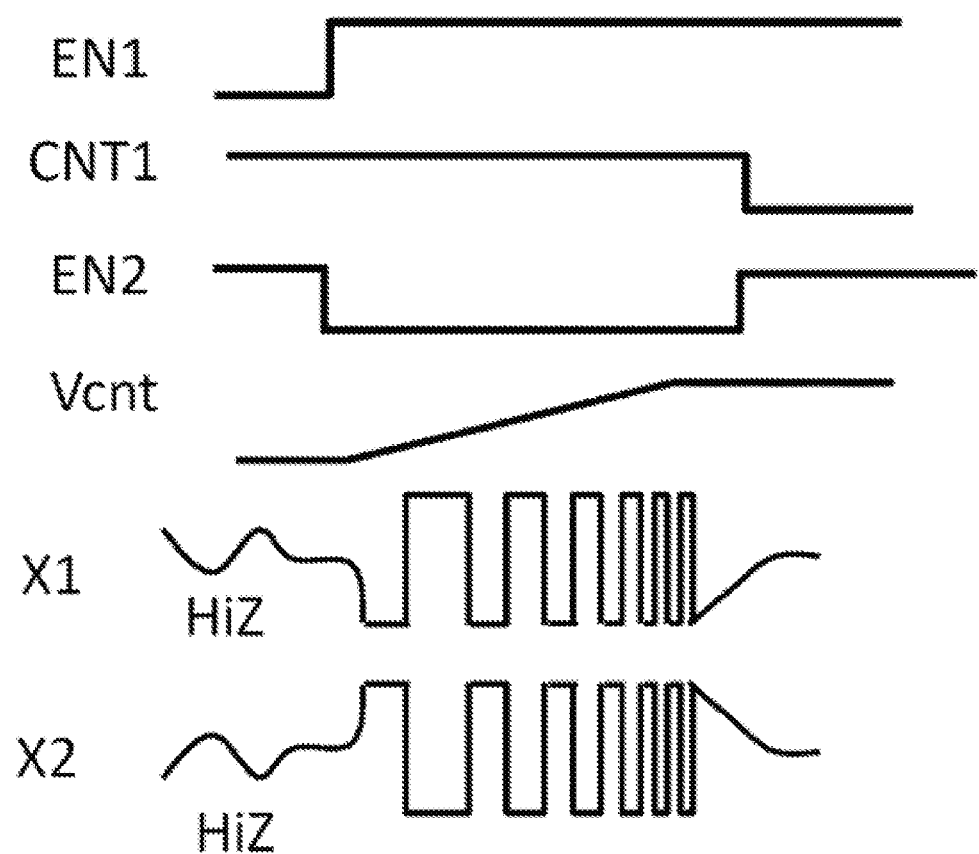
FIG. 2 is a waveform diagram for describing an operation of a first noise application circuit NIC1 in FIG. 1.

The operation of the noise application circuit NIC1 will be described with reference to FIG. 1 and FIG. 2. FIG. 2 is a waveform diagram for describing the operation of the first noise application circuit NIC1 in FIG. 1. FIG. 2 shows the waveforms of the enable signals EN1 and EN2, the voltage Vcnt, the output of the counter CNT1, and the external terminals X1 and X2.

The noise application circuit NIC1 is used in the state where the oscillation amplifier AMP and the second-stage noise application circuit NIC2 are turned off. At this time, the enable signal EN1 is at the high level (EN1=H (high level)), the switches SW1 and SW2 are turned on (SW1=SW2=ON (ON state)), and the switch SW3 is turned off (SW3=OFF (OFF state)). The switches SW1 and SW2 are provided such that the output of the voltage controlled oscillator VCO is applied to the external terminals X1 and X2 when the noise application circuit NIC1 is operating and the output of the voltage controlled oscillator VCO is disconnected from the external terminals X1 and X2 when the noise application circuit NIC1 is turned off.

The noise application circuit NIC1 is composed of the constant current circuit CSC, the current switch CSW, the capacitor element Ccnt, the voltage controlled oscillator VCO whose output frequency can be varied by the voltage Vcnt, and the counter CNT1 to which the output is connected. Also, the output of the voltage controlled oscillator VCO is connected to the input (wiring Lx1) and output (wiring Lx2) of the oscillation amplifier AMP, and phases of the output clocks of the voltage controlled oscillator VCO applied to the external terminals X1 and X2 are mutually inverted.

At the standby (EN1=L (low level)), the voltage Vcnt is at the GND level (ground potential level) by the current switch CSW. When the noise application circuit NIC1 starts operating, the voltage Vcnt is slowly charged to the VDD side with the time constant of the capacitor element Ccnt and the current I, and slowly increases the output frequency of the voltage controlled oscillator VCO, thereby crossing the resonance frequency of the crystal resonator XTAL and the frequency of the voltage controlled oscillator VCO.

The output of the voltage controlled oscillator VCO is connected also to the counter CNT1, and the noise application circuit NIC1 itself is turned off after a certain period of time has elapsed by counting the frequency thereof.

(Description of Second Noise Application Circuit NIC2)

The noise application circuit NIC2 starts operating after the operation of the noise application circuit NIC1 is completed. At this time, the noise application circuit NIC2 and the oscillation amplifier AMP are turned on (ON) at the same time, and the switches SW1 and SW2 are turned off and the switch SW3 is turned on (SW1=SW2=OFF and SW3=ON).

The noise application circuit NIC2 must be connected to the external terminal X1 (wiring Lx1). The reason why the noise application circuit NIC2 is connected to the external terminal X1 is that applying noise to the external terminal X1 is more effective in shortening the start-up time of the crystal oscillator circuit 10. Also, after the operation of the noise application circuit NIC1, the oscillation amplitude of the crystal resonator XTAL is generated at the external terminals X1 and X2, and the amplitude on the side of the external terminal X2 (wiring Lx2) grows more rapidly. However, the phases of the external terminals X1 and X2 at that time are not completely opposite phases, but are out of phase by about 90 degrees from 180 degrees. Therefore, it is not possible to invert the signal at the external terminal X2 and return it to the external terminal X1 (described later with reference to FIG. 3 and FIG. 4). For these reasons, it is necessary to amplify the signal at the external terminal X1 and return it to the external terminal X1 as it is. Here, in order to obtain the effect of shortening the start-up time, it is necessary to suppress the delay time from the capacitance coupling circuit CC1 to the third switch SW3 to ¼ or less of the period of the oscillation frequency (described later with reference to FIG. 5).

When the noise application circuit NIC2 starts operating, the oscillation amplitude of the external terminal X1 (wiring Lx1) is taken through the capacitance coupling circuit CC1, amplified by the clock conversion circuit CCC and the buffer circuit BAF1, converted into a clock, and returned to the external terminal X1 (wiring Lx1) through the capacitance coupling circuit CC2. When the noise application circuit NIC2 starts operating, the oscillation amplitude of the external terminal X1 (wiring Lx1) is very small, about 10 mVpp, as shown in FIG. 1, and cannot be directly converted into a clock. Therefore, the DC (direct current) voltage of the external terminal X1 of the oscillation amplifier AMP and the DC voltage of the clock conversion circuit CCC are separated by the capacitance coupling circuit CC1. At this time, the threshold of the DC voltage of the clock conversion circuit CCC is set by the threshold generation circuit IV2 in which the input and output of the inverter are short-circuited and the high-resistance resistor element Rbias for taking only the DC signal therefrom. In addition, since noise such as power supply noise is superimposed on the oscillation amplitude of the external terminal X1 with a small amplitude (about 10 mVpp), the clock conversion circuit CCC needs to have a Schmitt trigger circuit (having a noise removal function) in order to remove the noise. The Schmitt trigger circuit is an example of a return path with the noise removal function.

The buffer circuit BAF1 is connected to the output of the clock conversion circuit CCC in order to further amplify the output of the clock conversion circuit CCC and bring it closer to the ideal clock.

The capacitance coupling circuit CC2 is a capacitor for separating the DC voltage of the output of the buffer circuit BAF1 and the DC bias voltage of the external terminal X1. If the clock generated by the buffer circuit BAF1 is directly input to the external terminal X1 without passing through the capacitance coupling circuit CC2, the oscillation of the crystal resonator XTAL connected to the external terminal X1 will stop, and thus the capacitance coupling circuit CC2 is necessary.

Since the noise application circuit NIC2 continues to operate as it is, it must be stopped. The third switch SW3 is turned off after a certain period of time has elapsed by counting the output of the buffer circuit BAF1 with the counter CNT2, and the noise application circuit NIC2 itself is also turned off as needed.

(Description of Phases of External Terminals X1 and X2)

Figure 3:
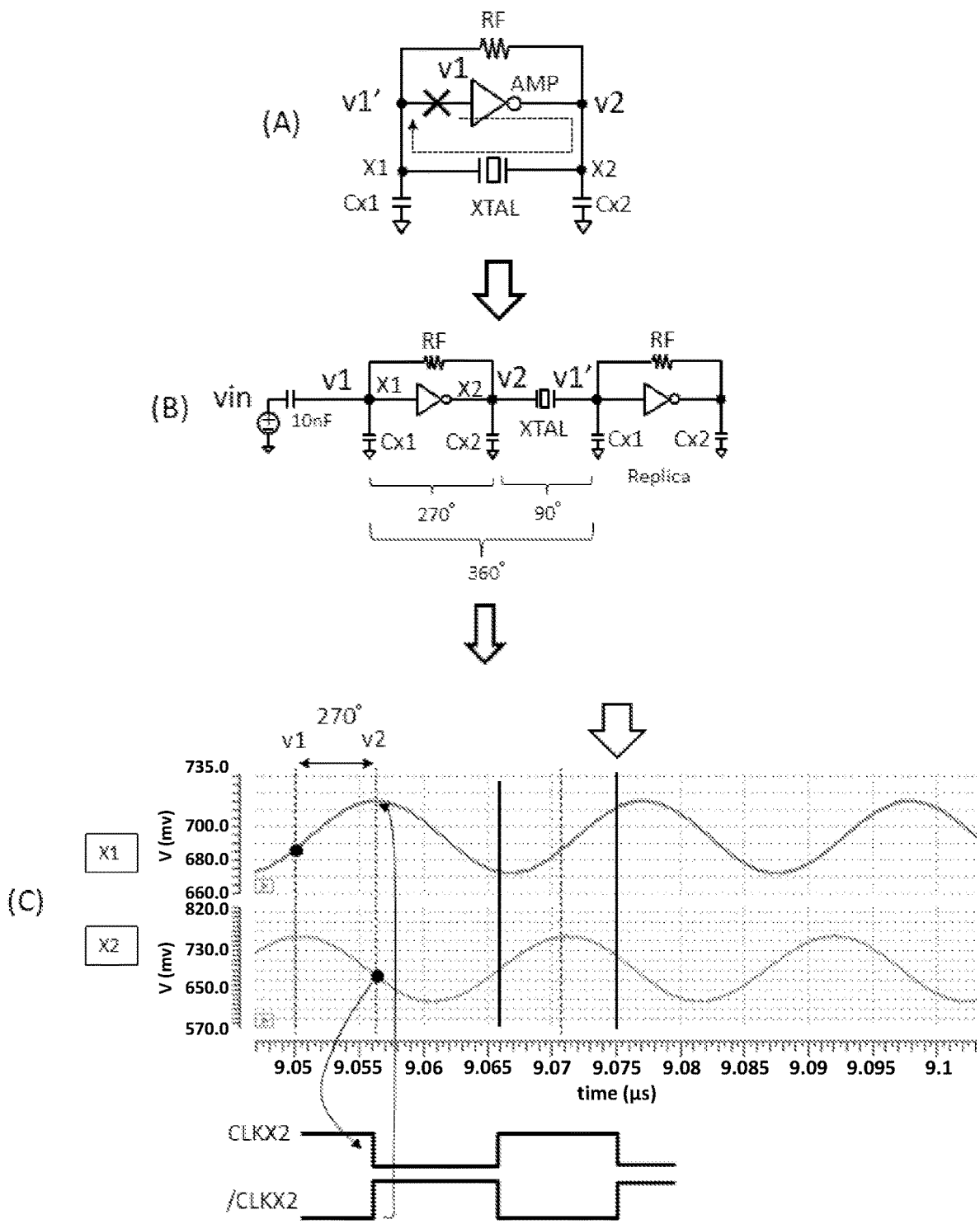
FIG. 3 is a diagram for describing an operation of a crystal oscillator circuit 10 when the amplitude is small immediately after the start of oscillation.

First, the operation of the crystal oscillator circuit 10 when the amplitude is small immediately after the start of oscillation will be described with reference to FIG. 3. FIG. 3 is a diagram for describing the operation of the crystal oscillator circuit 10 when the amplitude is small immediately after the start of oscillation. In FIG. 3, (A) shows the configuration of the crystal oscillator circuit 10, the simulation is performed in the equivalent circuit configuration shown in (B) obtained by cutting the loop formed by the oscillation amplifier AMP and the crystal resonator XTAL at the position marked with ×, and the phases of points v1 (X1), v2 (X2), and v1' are considered. (C) of FIG. 3 is a graph showing the results of the simulation.

When the amplitude is small immediately after the start of oscillation, the phase difference between the external terminals X1 and X2 is 270°. As shown in (C) of FIG. 3, since the amplitude of the external terminal X2 grows rapidly, clock conversion of the amplitude of the external terminal X2 seems better. However, the phase difference between the external terminals X1 and X2 is 270° instead of 180° when the amplitude is small immediately after the start of oscillation. Therefore, even if the amplitude of the external terminal X2 is converted into a clock (CLKX2), inverted to generate an inverted clock (/CLKX2), and then returned to the external terminal X1 with a zero delay difference, the condition of within ¼ period of the oscillation frequency period (T3) (>(¼)·T3) cannot be observed. Namely, when the clock is generated (CLKX2) at the external terminal X2 (point v2) and then returned to the external terminal X1 (point v1), the shift of ¼ period or more always occurs. Therefore, it is necessary to generate a clock from the external terminal X1 and return it to the external terminal X1.

Figure 4:
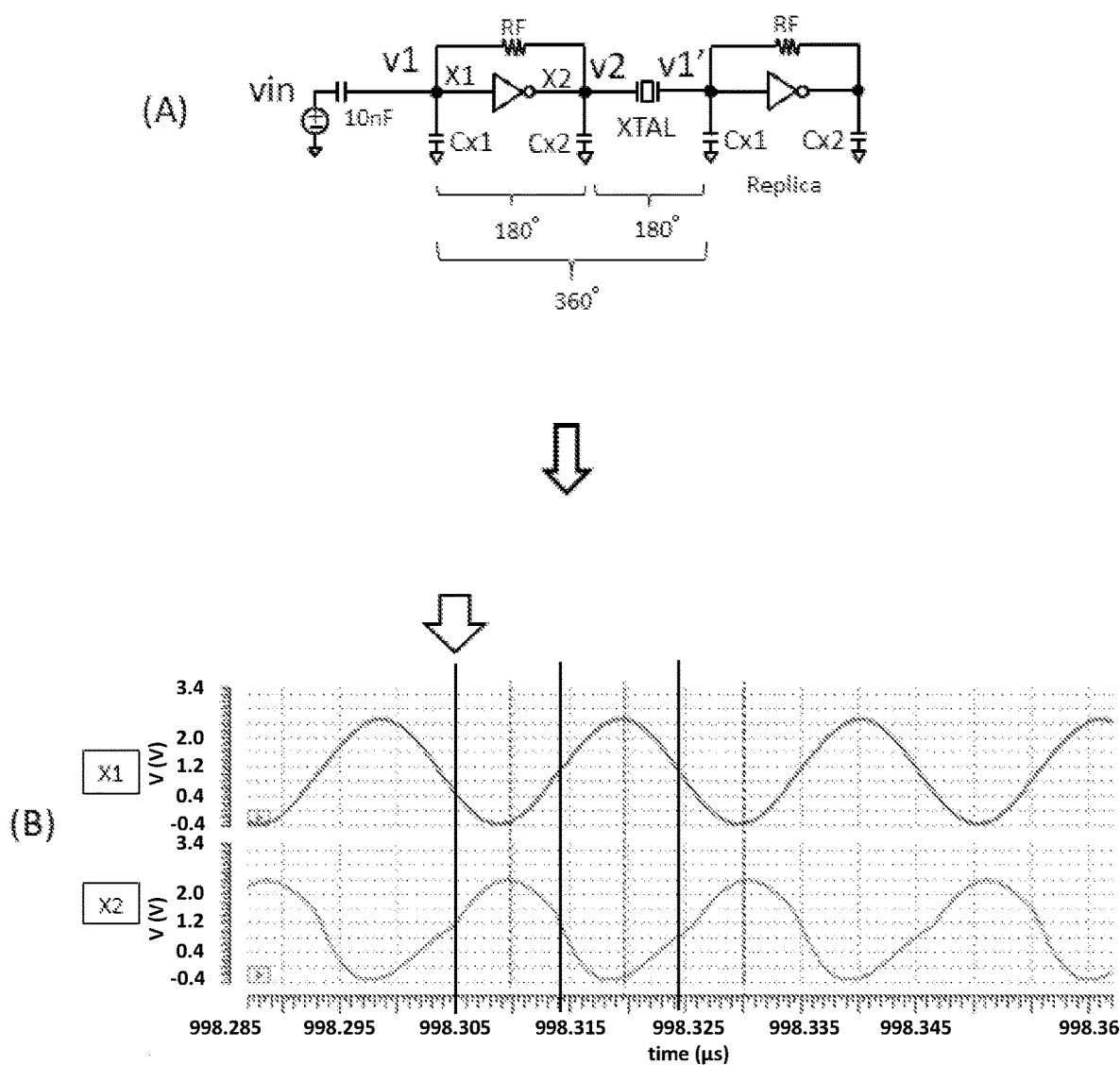
FIG. 4 is a diagram for describing an operation of the crystal oscillator circuit 10 when the amplitude is large after the oscillation is stabilized.

Next, the operation of the crystal oscillator circuit 10 when the amplitude is large after the oscillation is stabilized will be described with reference to FIG. 4. FIG. 4 is a diagram for describing the operation of the crystal oscillator circuit 10 when the amplitude is large after the oscillation is stabilized. In FIG. 4, (A) shows an equivalent circuit configuration of the crystal oscillator circuit 10, the simulation is performed in this circuit configuration, and the phases of points v1 (X1), v2 (X2), and v1' are considered. (B) of FIG. 4 is a graph showing the simulation results. When the amplitude is large after the oscillation is stabilized, the phase difference between the external terminals X1 and X2 is 180°.

(Description of Waveform inside Noise Application Circuit NIC2)

Figure 5:
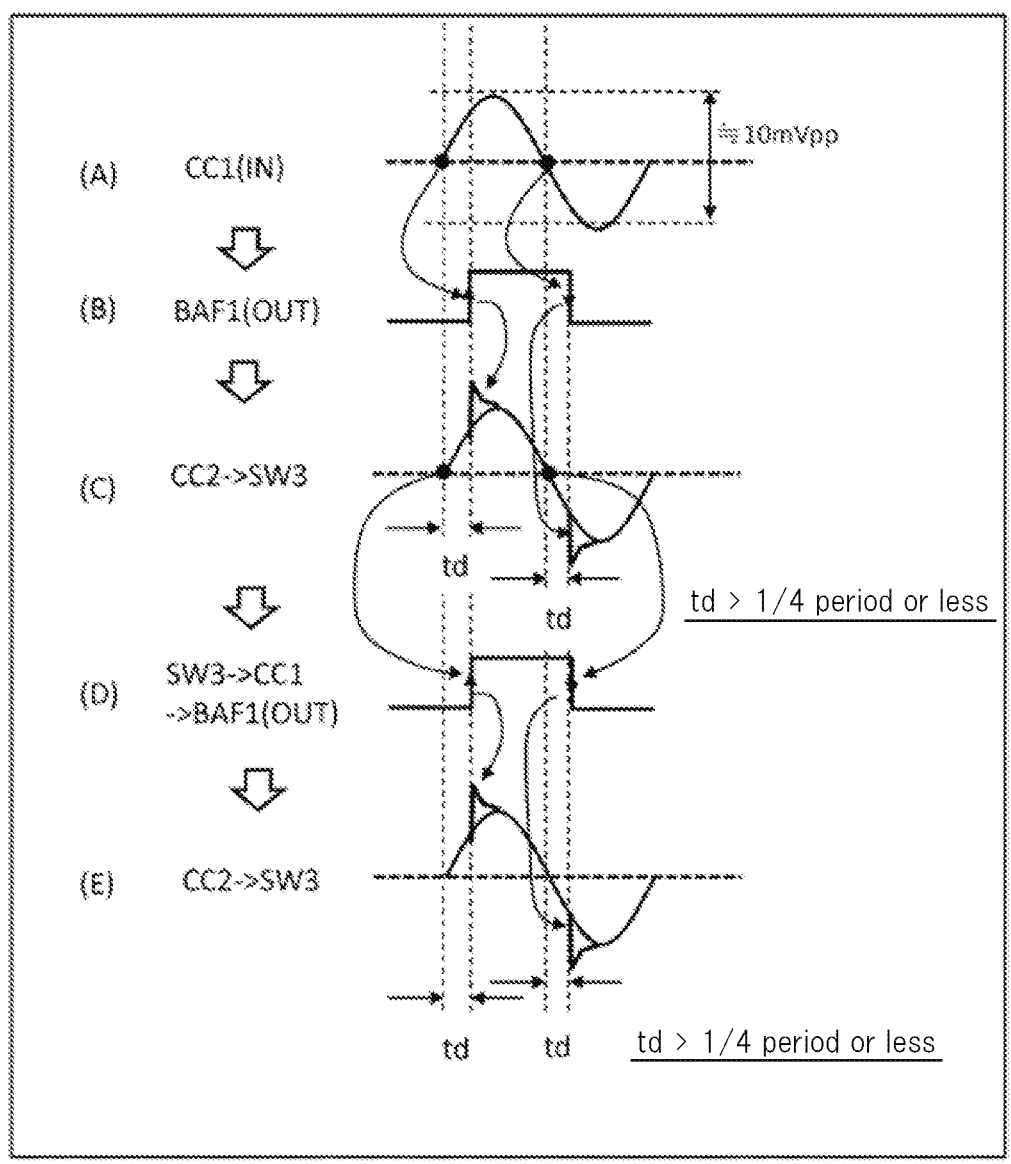
FIG. 5 is a diagram for describing operation waveforms in a noise application circuit NIC2.

Next, the waveforms inside the noise application circuit NIC2 will be described with reference to FIG. 5. FIG. 5 is a diagram for describing the operation waveforms in the noise application circuit NIC2.

In FIG. 5, (A) shows the waveform of the first capacitance coupling circuit CC1, and the difference potential between peaks of the waveform (difference potential between the highest value and the lowest value) is approximately 10 mVpp. (B) shows the waveform of the output of the buffer circuit BAF1. The waveform (B) of the output of the buffer circuit BAF1 corresponds to a clock generated from the waveform (A) of the capacitance coupling circuit CC1. (C) shows the waveform of the third switch SW3 after passing through the buffer circuit BAF1 and the second capacitance coupling circuit CC2. Electric charges are charged by the output of the buffer circuit BAF1 and the second capacitance coupling circuit CC2. The delay time td between the capacitance coupling circuit CC1 and the output of the buffer circuit BAF1 is set to ¼ period or less. (D) shows the waveform of the output of the buffer circuit BAF1 of the signal returned from the third switch SW3 to the capacitance coupling circuit CC1, and clock generation is repeated. (E) shows the waveform of the third switch SW3 after passing through the buffer circuit BAF1 and the second capacitance coupling circuit CC2 again, and the charging operation is repeated.

Figure 6:
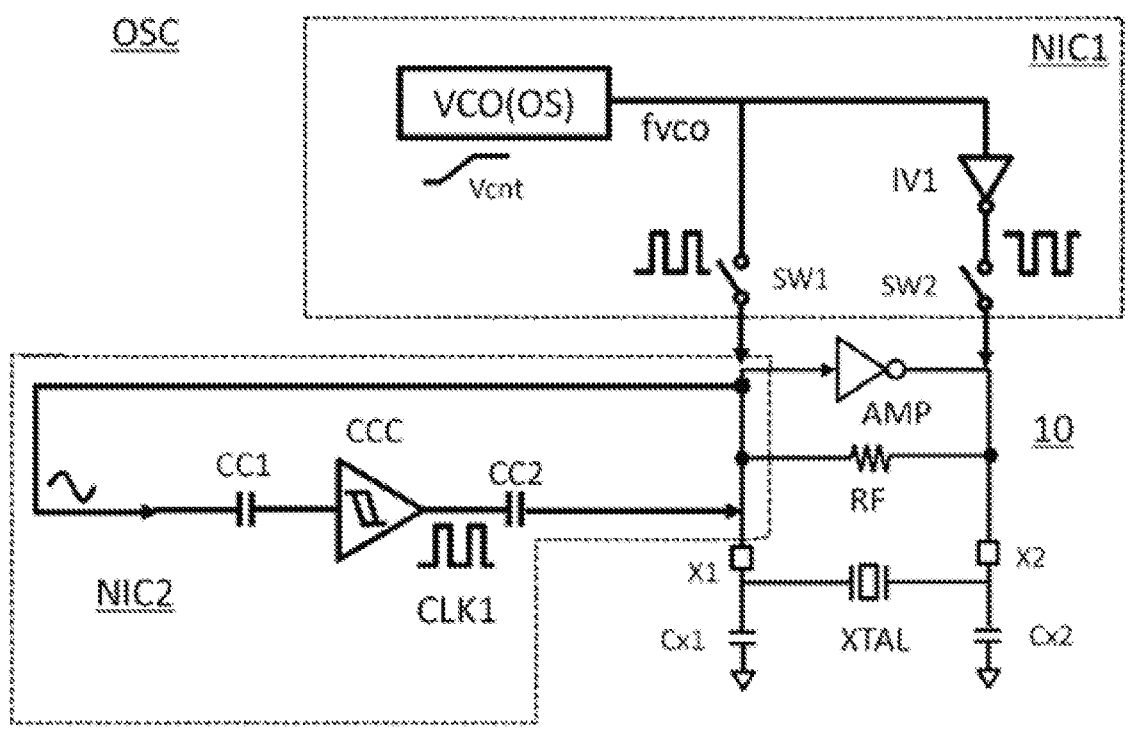
FIG. 6 is an equivalent circuit diagram of an oscillator circuit OSC in the first embodiment.
Figure 7:
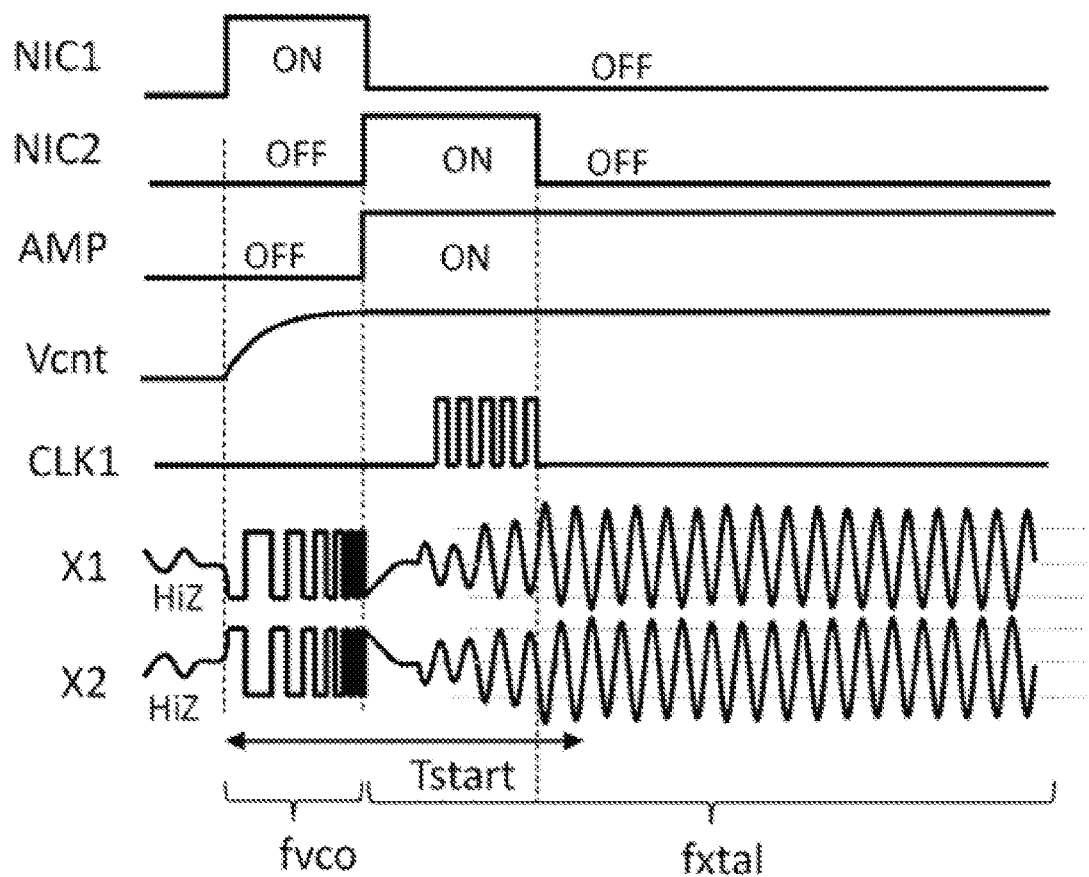
FIG. 7 is a waveform diagram for describing an operation of the oscillator circuit OSC in the first embodiment.

Next, the present embodiment will be summarized with reference to FIG. 6 and FIG. 7. FIG. 6 is an equivalent circuit diagram of the oscillator circuit OSC in the first embodiment. FIG. 7 is a waveform diagram for describing the operation of the oscillator circuit OSC in the first embodiment.

As shown in FIG. 6, in the oscillator circuit OSC in the first embodiment, by connecting the first-stage noise application circuit NIC1 and the second-stage noise application circuit NIC2 to the crystal oscillator circuit 10, the start-up time of the oscillator circuit OSC is shortened. In FIG. 6, the noise application circuit NIC1 is equivalently illustrated so as to include the voltage controlled oscillator VCO which is an oscillator circuit (OS), the first switch SW1 which selectively supplies the oscillation output (fvco) of the voltage controlled oscillator VCO to the external terminal X1, the inverter IV1 for inverting the oscillation output (fvco) of the voltage controlled oscillator VCO, and the switch SW2 for selectively supplying the oscillation output inverted by the inverter to the external terminal X2. The noise application circuit NIC2 includes the clock conversion circuit CCC which is an amplifier circuit, the first capacitance coupling circuit CC1 connected between the external terminal X1 and the input terminal of the clock conversion circuit CCC, and the second capacitance coupling circuit CC2 connected between the output of the clock conversion circuit CCC and the external terminal X1.

The noise for shortening the start-up time is applied to the crystal oscillator circuit 10 separately as the first noise generated from the first-stage noise application circuit NIC1 and the second noise generated from the second-stage noise application circuit NIC2.

The noise application of the second-stage noise application circuit NIC2 is characterized by amplifying a signal with exactly the same frequency as the resonance frequency (fxtal) of the crystal resonator XTAL and applying it to the crystal resonator XTAL.

After the first-stage noise application circuit NIC1 is turned off, the second-stage noise application circuit NIC2 and the oscillation amplifier AMP are turned on together for use. In the noise application circuit NIC2, a crystal oscillation signal with a small amplitude generated at the external terminal X1 by the first-stage noise application circuit NIC1 is amplified by the capacitance coupling circuit CC1, the clock conversion circuit CCC which is an amplifier circuit, and the capacitance coupling circuit CC2, and is returned to the external terminal X1 which is the input of the noise application circuit NIC2 itself.

As shown in FIG. 7, first, the noise application circuit NIC1 is turned on (at this time, the noise application circuit NIC2 and the oscillation amplifier AMP are OFF). Thereby, the voltage controlled oscillator VCO oscillates based on the voltage Vcnt. Then, the oscillation output (fvco) of the voltage controlled oscillator VCO and its inverted oscillation signal are applied to the external terminals X1 and X2 as the first noise.

Next, the noise application circuit NIC1 is turned off, and the noise application circuit NIC2 and the oscillation amplifier AMP are turned on. The clock signal CLK1 is generated in the noise application circuit NIC2, and the signal obtained by passing the clock signal CLK1 through the capacitance coupling circuit CC2 is applied to the external terminal X1 as the second noise. The second noise is a signal with exactly the same frequency as the resonance frequency (fxtal) of the crystal resonator XTAL. Thereby, the crystal oscillator circuit 10 starts to oscillate.

Thereafter, the noise application circuit NIC2 is turned off, and the crystal oscillator circuit 10 oscillates with good frequency accuracy (state of oscillation at fxtal). Therefore, the start-up time Tstart of the crystal oscillator circuit 10 can be shortened. Here, the start-up time Tstart is the time from when the noise application circuit NIC1 is turned on to when the crystal oscillator circuit 10 oscillates with good frequency accuracy.

According to the first embodiment, the following effects can be obtained.

(1) The start-up time of the crystal oscillator circuit can be greatly reduced. In the first embodiment, in the case of using a crystal resonator of 16 MHz, the start-up time of the crystal oscillator circuit can be shortened to the range from 0.14 ms to ms. The start-up time of the conventional crystal oscillator circuit prior to the first embodiment is in the range from 0.98 ms to 1.40 ms.

(2) In the semiconductor device applications in which frequency accuracy of the crystal resonator and low power consumption are required, intermittent operation of the semiconductor device makes it possible to reduce the power consumption of the semiconductor device.

(3) The start-up time of the crystal oscillator circuit can be shortened, and the overall circuit scale of the oscillator circuit OSC can be reduced. Since the overall circuit scale of the oscillator circuit OSC is small, it is possible to prevent the increase in the chip area of the semiconductor device, and the application to mass-produced semiconductor devices is easy.

Second Embodiment

Figure 8:
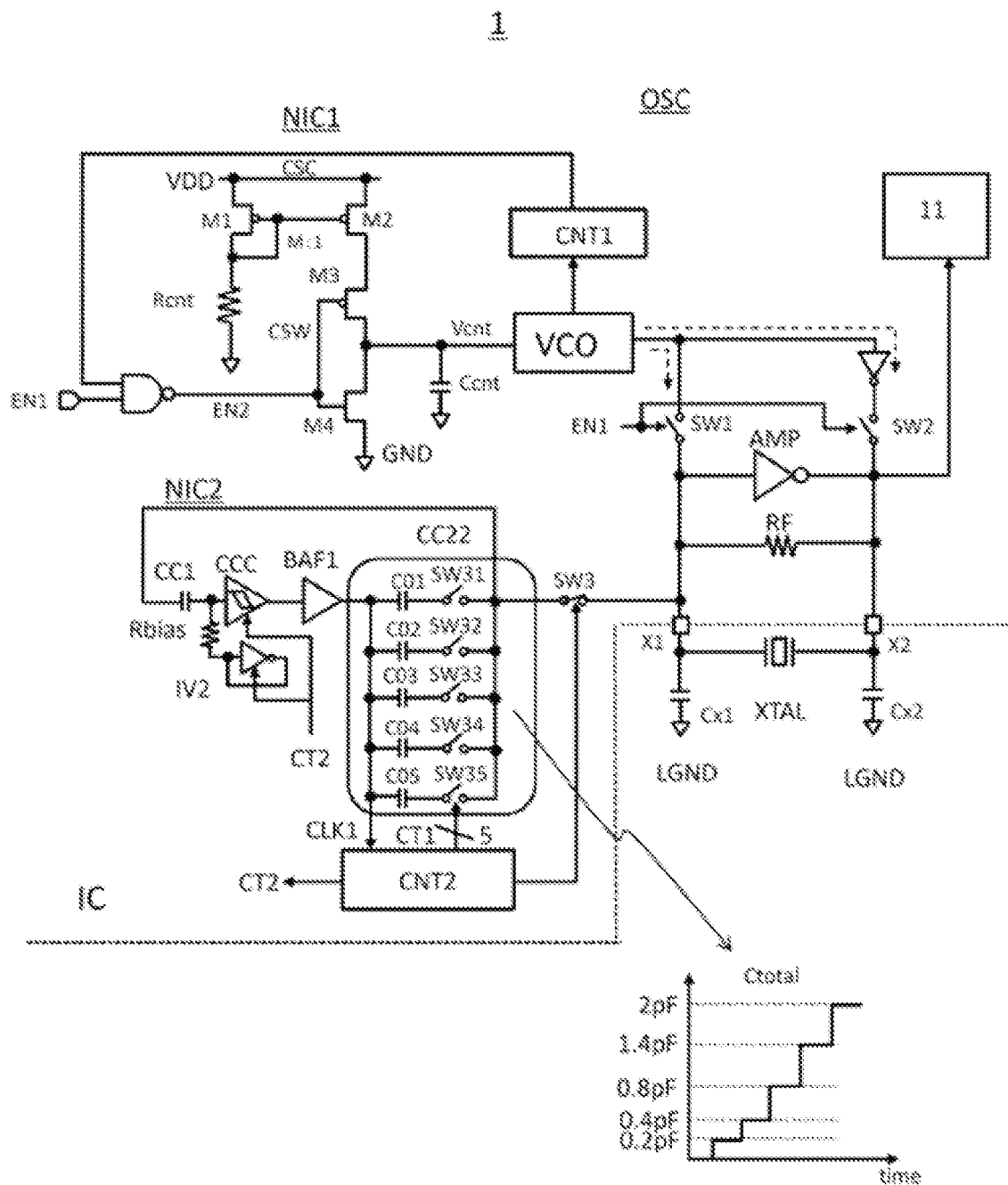
FIG. 8 is a schematic configuration diagram of a semiconductor device including a crystal oscillator circuit according to the second embodiment.
Figure 9:
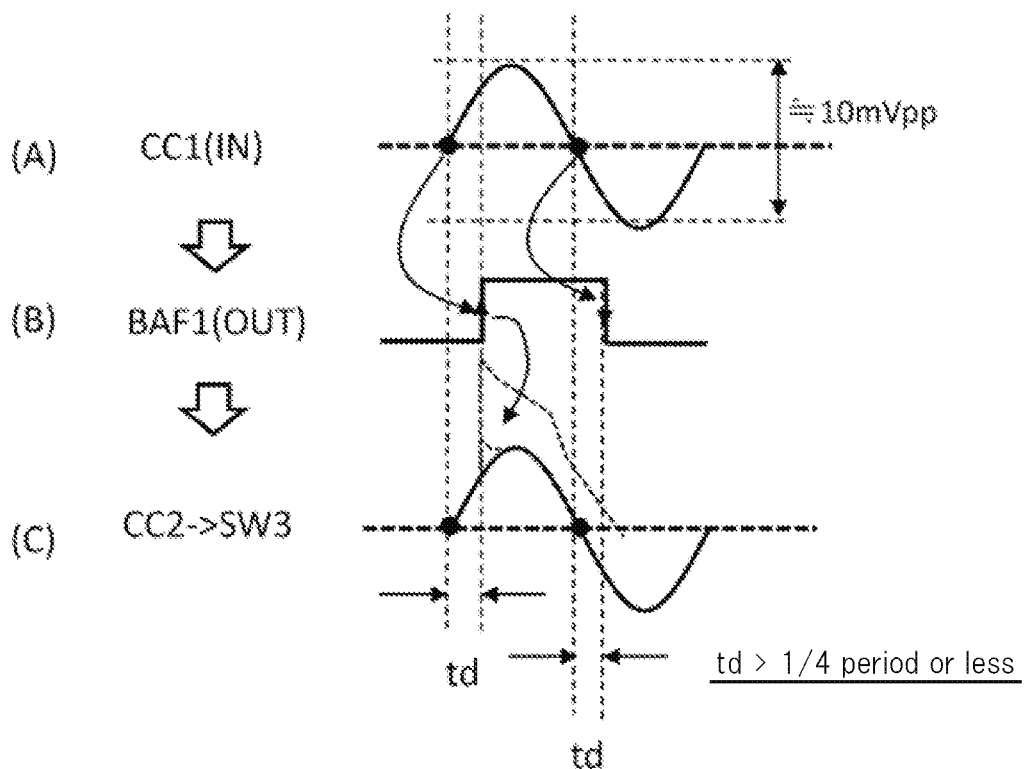
FIG. 9 is a diagram for describing operation waveforms in the noise application circuit NIC2 in FIG. 8.

Next, the oscillator circuit OSC according to the second embodiment will be described with reference to FIG. 8. FIG. 8 is a schematic configuration diagram of a semiconductor device including a crystal oscillator circuit according to the second embodiment. FIG. 9 is a diagram for describing operation waveforms in the noise application circuit NIC2 in FIG. 8.

The oscillator circuit OSC according to the second embodiment differs from the oscillator circuit OSC according to the first embodiment in that the capacitance coupling circuit CC2 is composed of, for example, five capacitor elements C01 to C05 and five switch elements (capacitor selection switch elements) SW31 to SW35. The five switch elements SW31 to SW35 of the five capacitor elements C01 to C05 are connected between the output terminal of the buffer circuit BAF1 and the third switch SW3 (external terminal X1). Namely, a plurality of pairs of one capacitor element and one switch element are connected in parallel between the output terminal of the buffer circuit BAF1 and the third switch SW3. Capacitance values of the respective capacitor elements C01 to C05 are set to weighted capacitance values such as 0.2 pF, 0.2 pF, 0.4 pF, 0.6 pF, and 0.6 pF. The output of the second counter circuit CNT2 is connected to the newly added switch elements SW31 to SW35 (one switch element is provided for one capacitor element). The switch elements SW31 to SW35 are configured to be able to change the overall capacitance value of the capacitance coupling circuit CC2. The switch elements SW31 to SW35 are controlled to be turned on and off by the output of the second counter circuit CNT2 such that the overall capacitance value of the capacitance coupling circuit CC2 increases step by step over time in accordance with the count number of the counter circuit CNT2. Namely, the switch element SW31 is first turned on, then the switch element SW32 is turned on, the switch element SW33 is turned on, the switch element SW34 is turned on, and finally the switch element SW35 is turned on. Thereby, the overall capacitance value (Ctotal) of the capacitance coupling circuit CC2 changes from 0.2 pF to 0.4 pF, 0.8 pF, 1.4 pF, and 2.0 pF. In this way, the effect of shortening the start-up time is increased.

The second counter circuit CNT2 is provided in order to increase the capacitance value between the output terminal of the clock conversion circuit CCC and the third switch SW3 over time by counting the output clock of the clock conversion circuit CCC and sequentially turning on the switch elements SW31 to SW35 of the capacitor elements C01 to C05 for each predetermined time. The five control signals CT1 of the counter output of the second counter circuit CNT2 are connected to each of the five switch elements SW31 to SW35. After the completion of the activation, these five switch elements SW31 to SW35 and the third switch element SW3 are turned off based on the counter output of the second counter circuit CNT2. A control signal CT2 which is the output signal of the second counter circuit CNT2 stops the entire second noise application circuit NIC2 (clock conversion circuit CCC as an amplifier circuit and threshold generation circuit IV2 as a bias setting circuit) after a certain period of time has elapsed. Although not shown in FIG. 1, the stop of the clock conversion circuit CCC and the threshold generation circuit IV2 by the control signal CT2 can also be used in the first embodiment.

In FIG. 9, (A) shows the waveform of the first capacitance coupling circuit CC1, and the difference potential between peaks of the waveform (difference potential between the highest value and the lowest value) is approximately 10 mVpp. (B) shows the waveform of the output of the buffer circuit BAF1. The waveform (B) of the output of the buffer circuit BAF1 corresponds to a clock generated from the waveform (A) of the capacitance coupling circuit CC1. (C) shows the waveform of the third switch SW3 after passing through the buffer circuit BAF1 and the second capacitance coupling circuit CC2. Electric charges are charged by the output of the buffer circuit BAF1 and the second capacitance coupling circuit CC2. The delay time td between the capacitance coupling circuit CC1 and the output of the buffer circuit BAF1 is set to ¼ period or less. Although charging is performed by the capacitance coupling circuit CC2, the effect will be small if the capacitance value of the capacitance coupling circuit CC2 is too small with respect to the amplitude of the sine wave in (C), and the sine wave will be distorted and phase shifting will occur if it is too large. Therefore, the capacitance value of the capacitance coupling circuit CC2 needs to be optimized in accordance with the amplitude. For that purpose, as shown in the capacitance coupling circuit CC2 in FIG. 8, the capacitance coupling circuit CC2 is composed of the five capacitor elements C01 to C05 and the five switches SW31 to SW35, so that the overall capacitance value of the capacitance coupling circuit CC2 can be adjusted to the optimum value in accordance with the amplitude. Thereby, the start-up time of the crystal oscillator circuit 10 is shortened.

The same effects as those of the first embodiment can be obtained also in the second embodiment.

In the foregoing, the invention made by the inventors of this disclosure has been specifically described above based on embodiments. However, it is needless to say that the present invention is not limited to the above embodiments and examples and can be modified in various ways.

What is claimed is:

1. A semiconductor device comprising:
   a first external terminal;
   a second external terminal;
   a crystal oscillator circuit connected to the first external terminal and the second external terminal;
   a first noise application circuit connected to the crystal oscillator circuit; and
   a second noise application circuit connected to the crystal oscillator circuit,
   wherein the crystal oscillator circuit includes:
      an oscillation amplifier connected between the first external terminal and the second external terminal;
      a feedback resistor element connected between the first external terminal and the second external terminal;
      an external first capacitor element connected between the first external terminal and an external ground potential line;

an external second capacitor element connected between the second external terminal and the external ground potential line; and
an external crystal resonator connected between the first external terminal and the second external terminal,
wherein the first noise application circuit is configured to drive the crystal resonator by selectively applying initial noises of opposite phases to the first external terminal and the second external terminal,
wherein the second noise application circuit includes:
a third switch;
a first capacitance coupling circuit;
an amplifier circuit; and
a second capacitance coupling circuit,
wherein the third switch is provided between the first external terminal and the first capacitance coupling circuit,
wherein the amplifier circuit is provided between the first capacitance coupling circuit and the second capacitance coupling circuit,
wherein the second capacitance coupling circuit is connected to the first external terminal via the third switch,
wherein the first capacitance coupling circuit is provided so as to take an alternating current component of a signal at the first external terminal by separating a direct current voltage at the first external terminal from a direct current voltage at an input terminal of the amplifier circuit,
wherein the second capacitance coupling circuit is provided so as to output an alternating current component of the amplifier circuit by separating a direct current voltage at an output terminal of the amplifier circuit from a direct current voltage at the first external terminal,
wherein the amplifier circuit is provided so as to amplify the alternating current component taken by the first capacitance coupling circuit, convert it into a clock signal, and drive the first external terminal with the converted clock signal,
wherein the third switch is provided so as to prevent capacitance values of the first capacitance coupling circuit and the second capacitance coupling circuit from affecting oscillation by separating the amplifier circuit from the first external terminal after activation of the crystal oscillator circuit is completed, and
wherein a second noise is applied to the first external terminal by amplifying the signal at the first external terminal and returning the amplified signal to the first external terminal by the second noise application circuit, thereby driving the oscillation amplifier and the crystal resonator and shortening a start-up time of the crystal oscillator circuit.

2. The semiconductor device according to claim 1, wherein the amplifier circuit has a noise removal function so as to remove harmonic components due to power supply noise and amplify only signal components.

3. The semiconductor device according to claim 1, wherein the first noise application circuit includes:
an oscillator;
a first switch provided between an output terminal of the oscillator and the first external terminal; and
an inverter circuit and a second switch provided between the output terminal of the oscillator and the second external terminal,
wherein the oscillator generates the initial noises, and
wherein the first switch and the second switch are turned off after applying the initial noises to the first external terminal and the second external terminal.

4. The semiconductor device according to claim 3, wherein the oscillator includes a voltage controlled oscillator, and
wherein a frequency of the voltage controlled oscillator is slowly increased, thereby crossing a resonance frequency of the crystal resonator and a frequency of the voltage controlled oscillator.

5. The semiconductor device according to claim 1, wherein the second capacitance coupling circuit includes:
a counter circuit in which a plurality of pairs of one capacitor element and one switch element are connected in parallel and which is configured to count output clocks of the amplifier circuit, and
wherein the counter circuit increases a capacitance value between the output terminal of the amplifier circuit and the first external terminal over time by sequentially turning on the switch elements of the plurality of pairs for each predetermined time.

6. The semiconductor device according to claim 5, wherein the plurality of switch elements and the third switch are turned off after activation of the crystal oscillator circuit is completed.

7. The semiconductor device according to claim 5, comprising:
a bias setting circuit configured to set the input terminal of the amplifier circuit to a predetermined bias potential,
wherein a control signal generated by the counter circuit stops operations of the amplifier circuit and the bias setting circuit after a certain period of time has elapsed.

8. The semiconductor device according to claim 1, wherein the second capacitance coupling circuit includes:
a counter circuit configured to count output clocks of the amplifier circuit; and
a bias setting circuit configured to set the input terminal of the amplifier circuit to a predetermined bias potential.

9. The semiconductor device according to claim 8, wherein a control signal generated by the counter circuit stops operations of the amplifier circuit and the bias setting circuit after a certain period of time has elapsed.

* * * * *